(12) United States Patent
Kurihara et al.

(10) Patent No.: US 9,305,965 B2
(45) Date of Patent: Apr. 5, 2016

(54) SOLID-STATE IMAGING APPARATUS AND METHOD OF MANUFACTURING THE SAME

(71) Applicant: CANON KABUSHIKI KAISHA, Tokyo (JP)

(72) Inventors: Masaki Kurihara, Koza-gun (JP); Daisuke Shimoyama, Aiko-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/147,279

(22) Filed: Jan. 3, 2014

(65) Prior Publication Data

US 2014/0191349 A1    Jul. 10, 2014

(30) Foreign Application Priority Data

Jan. 16, 2013  (JP) ................... 2013-005697

(51) Int. Cl.
*H01L 27/146*    (2006.01)

(52) U.S. Cl.
CPC .... *H01L 27/14685* (2013.01); *H01L 27/14621* (2013.01); *H01L 27/14627* (2013.01)

(58) Field of Classification Search
CPC ............ H01L 27/146; H01L 27/14601; H01L 27/14609; H01L 27/14621; H01L 27/14643; H01L 27/14645; H01L 31/02162
USPC ........................... 257/431–436, 443, 457, 459
See application file for complete search history.

(56) References Cited

U.S. PATENT DOCUMENTS

| 7,265,328 | B2 * | 9/2007 | Mouli ....................... 250/208.1 |
| 7,579,639 | B2 | 8/2009 | Jung |
| 8,373,786 | B2 | 2/2013 | Otsuka et al. |
| 2006/0081898 | A1 | 4/2006 | Wang et al. |
| 2006/0138485 | A1 * | 6/2006 | Jung ............................. 257/292 |
| 2010/0066876 | A1 | 3/2010 | Kurihara |
| 2013/0293751 | A1 * | 11/2013 | Vaartstra ........... H01L 27/14625 348/280 |

FOREIGN PATENT DOCUMENTS

| CN | 1794463 | 6/2006 |
| JP | H1-100461 A | 7/1989 |
| JP | 2010-004018 A | 1/2010 |

* cited by examiner

*Primary Examiner* — Daniel Whalen
*Assistant Examiner* — Suberr Chi
(74) *Attorney, Agent, or Firm* — Fitzpatrick, Cella, Harper & Scinto

(57) ABSTRACT

The present invention provides a solid-state imaging apparatus which has hollow portions provided around each of color filters and achieves the prevention of the peeling of each of the color filters. The solid-state imaging apparatus having a plurality of light receiving portions provided on a semiconductor substrate includes: a plurality of color filters arranged correspondingly to each of the plurality of light receiving portions; and hollow portions formed around each of the plurality of color filters, wherein each of the color filters has one peripheral part contacting with adjacent one or more of the color filters.

7 Claims, 6 Drawing Sheets

POINT-CONTACT OF
COLOR FILTER

SOLID-STATE IMAGING APPARATUS AND METHOD OF MANUFACTURING THE SAME

BACKGROUND OF THE INVENTION

1. Field of the Invention

The present invention relates to a solid-state imaging apparatus (solid-state image sensing device) such as a CCD sensor and a CMOS sensor, and to a method of manufacturing the same.

2. Description of the Related Art

The technology is desired for a solid-state imaging apparatus, which enhances a light-concentrating efficiency to a light receiving portion and more efficiently concentrates incident light particularly with a sharp angle to the light receiving portion. For instance, in recent years, a solid-state imaging apparatus is proposed that has a structure in which a hollow portion is formed in a region corresponding to the periphery of a light receiving portion, and a light-concentrating efficiency to the light receiving portion is enhanced with the use of reflection on the boundary face of the hollow portion (for instance, see FIG. 23 in Japanese Patent Application Laid-Open No. 2010-4018).

Specifically, in Japanese Patent Application Laid-Open No. 2010-4018, a technology is disclosed which forms the above described hollow portion between each color filter that is provided correspondingly to each light receiving portion in the upper part of each of the light receiving portions as in FIG. 23. As for more details, in FIG. 23 of Japanese Patent Application Laid-Open No. 2010-4018, color filters of R, G and B are illustrated, which are color filters of so-called primary color system, and the hollow portions are formed so as to surround the peripheries of the color filters of R and B.

However, according to the above described technique of Japanese Patent Application Laid-Open No. 2010-4018, there has been the case where the peeling of the color filters (specifically, color filters of R and B) occurs in a cleaning step in a manufacturing process of the solid-state imaging apparatus, a thermal shock test to the solid-state imaging apparatus, or the like.

The present invention provides a solid-state imaging apparatus which can suppress the peeling of each of the color filters in a solid-state imaging apparatus having hollow portions provided between each of the color filters, and provides a method of manufacturing the same.

SUMMARY OF THE INVENTION

According to an aspect of the present invention, a solid-state imaging apparatus having a plurality of light receiving portions on at one surface of a semiconductor substrate comprises: a plurality of color filters arranged correspondingly to each of the plurality of light receiving portions; and a hollow portion formed around each of the plurality of color filter, wherein each of the plurality of color filters has one peripheral part contacting with an adjacent one or more of the plurality of color filters, and has the other peripheral part around the hollow portion.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Firstly, a first embodiment of the present invention will be described below.

Figure 1:
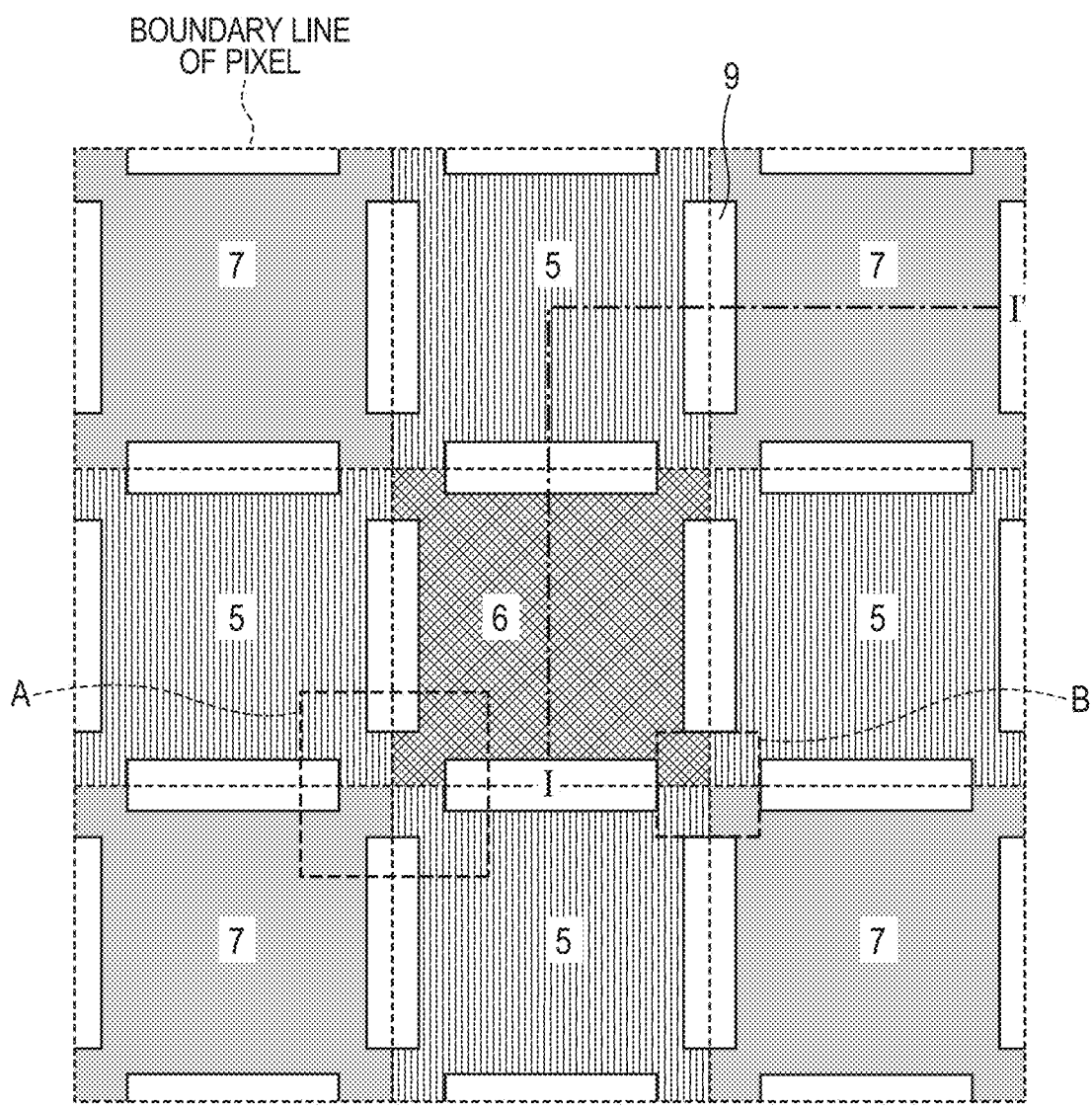
FIG. 1 is a top plan view of each color filter, which is one configuration of a solid-state imaging apparatus (solid-state image sensing device) according to a first embodiment of the present invention.

FIG. 1 is a top plan view of each of color filters 5 to 7, which is one configuration of a solid-state imaging apparatus (solid-state image sensing device) according to the first embodiment of the present invention. Here, a configuration for 9 pixels is illustrated in FIG. 1 as one example, in which any one color filter out of a first color filter 5, a second color filter 6 and a third color filter 7 is provided in every pixel. The first color filter 5, for instance, is a green (G) filter, the second color filter 6, for instance, is a red (R) filter, and the third color filter 7, for instance, is a blue (B) filter. Specifically, in the example illustrated in FIG. 1, an example of a so-called Bayer array is illustrated as the array of the color filters. However, in the present embodiment, the configuration is not limited to the mode illustrated in FIG. 1, and may be another array of color filters.

As is illustrated in FIG. 1, hollow portions (air gaps) 9 are formed around each of a plurality of the color filters 5 to 7. On this occasion, each of the color filters 5 to 7 has one peripheral part contacting with adjacent one or more of the color filters, and not all the perimeter of the periphery is surrounded by the hollow portion 9. In other words, it can be said that each of the color filters 5 to 7 has the other peripheral part around the hollow portion. As for more details, in the example illustrated in FIG. 1, each of the color filters 5 to 7 has a corner area contacting with adjacent one or more of the color filters. In addition, it is desirable that the hollow portion 9 has a width of 0.1 µm or less, from the viewpoint of enhancing the light-concentrating efficiency to the light receiving portion which is provided in every pixel.

Figure 2A:
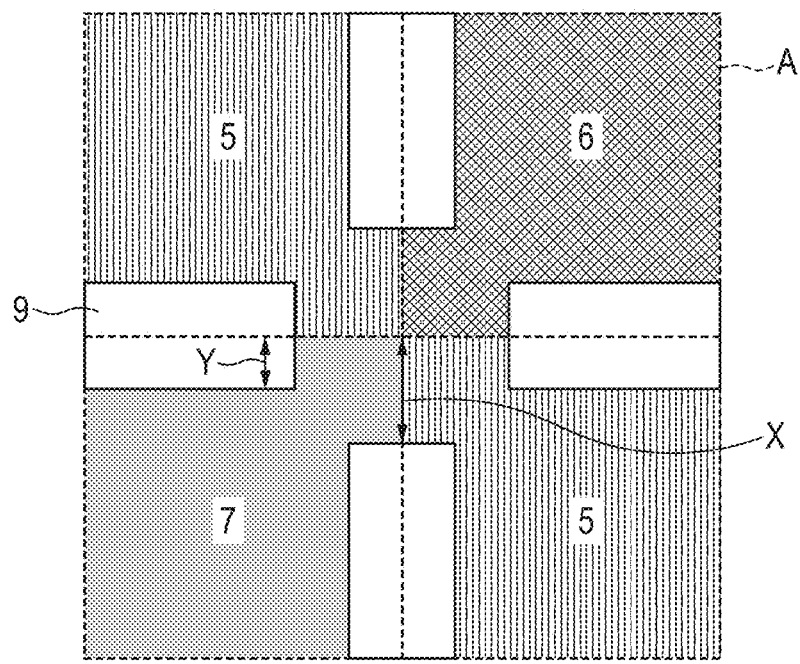
FIGS. 2A and 2B are enlarged views of a region A illustrated in FIG. 1.
Figure 2B:
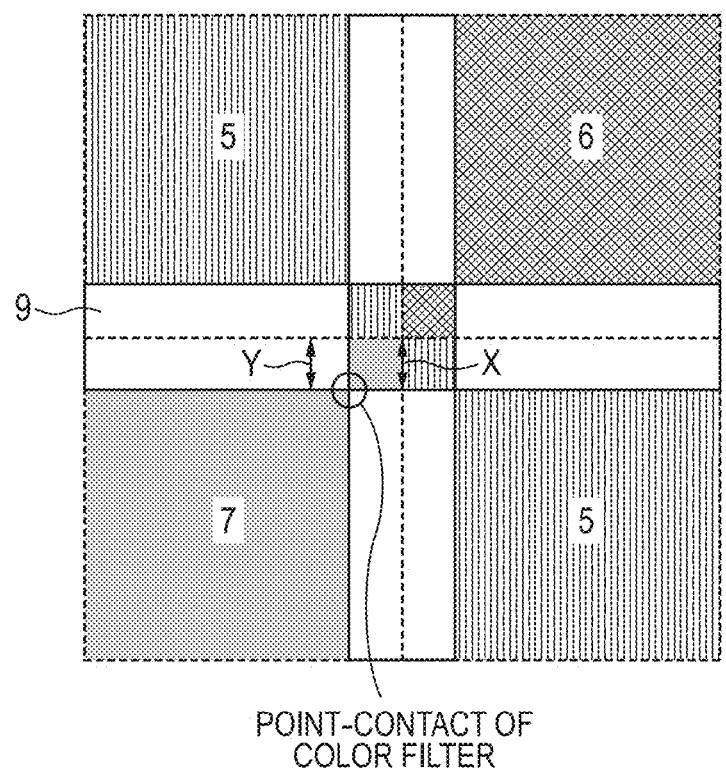

FIGS. 2A and 2B are enlarged views of a region A illustrated in FIG. 1.

FIG. 2A illustrates the case where a boundary line X between a third color filter 7 positioned in the lower left and a first color filter 5 adjacent in the right direction is longer than the length Y of ½ of a width of the hollow portion 9.

In addition, FIG. 2B illustrates the case where the boundary line X between the third color filter 7 positioned in the lower left and the first color filter 5 adjacent in the right direction is equal to the length Y of ½ of the width of the hollow portion 9. In this case, as is illustrated in FIG. 2B, the third color filter 7 and the like result in coming in point-contact with other color filters.

Specifically, in order that the third color filter 7 positioned in the lower left is formed so as to come in contact with another color filter in the corner area, it is necessary to control the boundary line X contacting with the adjacent color filter in the right direction and the like so as to be longer than the length Y of ½ of the width of the hollow portion. When this is generalized, the boundary line (length X) between each of the color filters 5 to 7 and a color filter adjacent at least in one direction out of vertical and horizontal directions is necessary to satisfy a condition of being longer than the length of ½ of the width of the hollow portion 9 (longer than length Y). In the present embodiment, each of color filters 5 to 7 is formed so as to satisfy the condition.

FIGS. 3A to 3E are schematic views illustrating one example of a method of manufacturing a solid-state imaging apparatus (solid-state image sensing device) according to the first embodiment of the present invention. Here, in the present embodiment, the cross section of the solid-state imaging apparatus illustrated in FIG. 3A to FIG. 3E corresponds to the cross section of I to I' illustrated in FIG. 1.

Figure 3A:
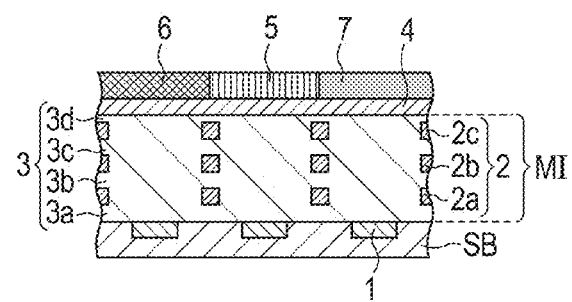
FIGS. 3A, 3B, 3C, 3D and 3E are schematic views illustrating one example of a method of manufacturing a solid-state imaging apparatus (solid-state image sensing device) according to the first embodiment of the present invention.

Firstly, FIG. 3A will be described below.

At first, a plurality of light receiving portions 1 are formed on the surface (upper face) of a semiconductor substrate SB, for instance, in a two-dimensional matrix form. Here, the semiconductor substrate SB is, for instance, a silicon substrate, and the light receiving portion 1 is, for instance, a photoelectric conversion element (photodiode).

Subsequently, a multi-layer wiring structure MI is formed on the upper face of the semiconductor substrate SB. This multi-layer wiring structure MI is produced by sequentially forming, for instance, a first interlayer insulation layer 3a, a first wiring layer 2a, a second interlayer insulation layer 3b, a second wiring layer 2b, a third interlayer insulation layer 3c, a third wiring layer 2c and a fourth interlayer insulation layer 3d, on the upper face of the semiconductor substrate SB. In addition, in the example illustrated in FIG. 3A, the upper face of the fourth interlayer insulation layer 3d is planarized, but may be not planarized. Here, the first interlayer insulation layer 3a to the fourth interlayer insulation layer 3d are collectively referred to as "interlayer insulation layer 3", and the first wiring layer 2a to the third wiring layer 2c are collectively referred to as "wiring layer 2". In addition, the wiring layer 2 may be formed with a so-called damascene process (method of forming a groove in the interlayer insulation layer 3 of a base coat, and embedding a metal layer which becomes the wiring layer 2 into the groove), or may be formed with a so-called etching method (technique of forming a metal layer on the interlayer insulation layer 3 of the base coat, and then etching the metal layer to form a pattern). In addition, the interlayer insulation layer 3 is formed from an inorganic material, for instance, of silicon oxide, silicon nitride or silicon oxynitride. In the present embodiment, the interlayer insulation layer 3 shall be formed from silicon oxide.

Subsequently, a first planarized layer 4 is formed on the multi-layer wiring structure MI. This first planarized layer 4 is formed from an organic material, for instance, of an acrylic resin base.

Subsequently, the first color filter 5, the second color filter 6 and the third color filter 7 which are a plurality of color filters are formed on the upper face of the first planarized layer 4 with the use of a photolithographic method. Here, each of the color filters to 7 is provided above each of the light receiving portions 1 so as to correspond to each of the light receiving portions 1, and is formed from an organic material, for instance, of an acrylic resin base. In addition, in the example illustrated in FIG. 3A, each of the color filters 5 to 7 is formed so as to have approximately the same film thickness, but may be formed so as to have different film thickness from others.

Figure 3B:
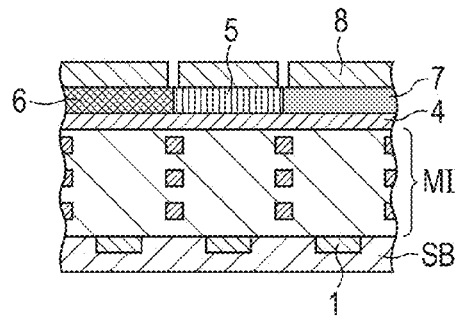

Subsequently, as is illustrated in FIG. 3B, a photoresist 8 which is opened in boundary portions between each of the color filters 5 to 7 is formed on the upper face of each of the color filters 5 to 7. This photoresist 8 has an aperture width of 0.1 μm or less. In the top plan view illustrated in FIG. 1, this photoresist 8 is formed on a region in which each of the color filters 5 to 7 is formed, and is not formed on a region in which the hollow portion 9 is formed (specifically, which becomes aperture). Accordingly, the photoresist 8 is formed in a region B illustrated in FIG. 1 (specifically, aperture does not exist therein).

Figure 3C:
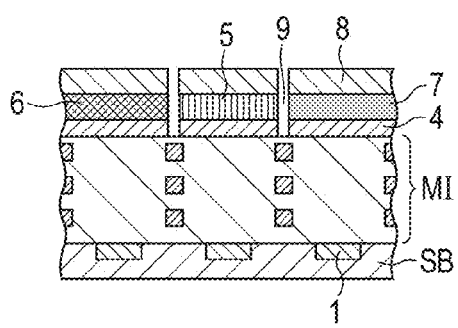

Subsequently, as is illustrated in FIG. 3C, each of the color filters 5 to 7 and the first planarized layer 4 in a portion which is not covered with a mask are removed by the etching which uses the photoresist 8 as the mask. Specifically, the boundary portion between each of the color filters 5 to 7, and the like, are removed. Thereby, the hollow portions (air gaps) 9 are formed between each of the color filters 5 to 7. Here, the hollow portion 9 has a width of 0.1 μm or less. In addition, the photoresist 8 is formed in the region B illustrated in FIG. 1, and the like, and accordingly the hollow portion 9 is not formed there.

Figure 3D:
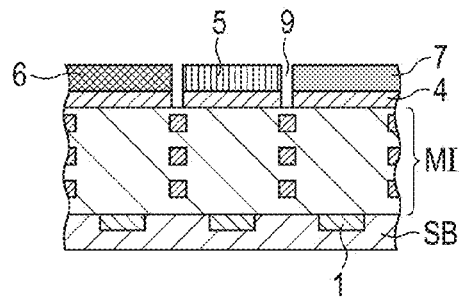

Subsequently, as is illustrated in FIG. 3D, the photoresist 8 is removed by asking.

Figure 3E:
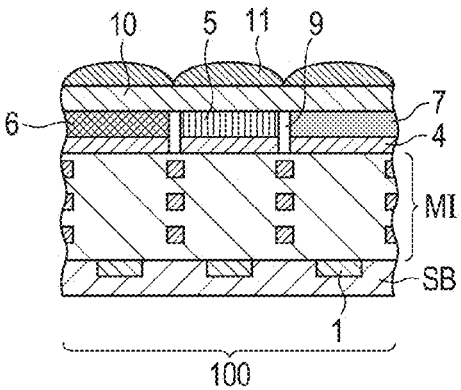

Subsequently, as is illustrated in FIG. 3E, a second planarized layer 10 is firstly formed on the whole surface including the upper face of each of the color filters 5 to 7. This second planarized layer 10 functions as a sealing layer which seals the aperture area of the hollow portion 9. In addition, the second planarized layer 10 is formed from an organic material, for instance, of an acrylic resin base.

Next, micro lenses 11 are formed on the upper face of the second planarized layer 10, above each of the color filters 5 to 7, correspondingly to each of the light receiving portions 1. This micro lens 11 is formed from an organic material, for instance, of an acrylic resin base.

Incidentally, the second planarized layer 10 is provided in the example illustrated in FIG. 3, but the present embodiment is not limited to this mode, and the structure illustrated in 10 and 11, for instance, may be integrally formed as a micro lens.

A solid-state imaging apparatus (solid-state image sensing device) 100 is produced through the above steps of FIG. 3A to FIG. 3E, in which a plurality of pixels having each of the light receiving portions 1 are arranged, for instance, in a two-dimensional matrix form.

In the first embodiment, as is illustrated in FIG. 1, each of the color filters 5 to 7 has one peripheral part contacting with adjacent one or more of the color filters, and has the other peripheral part around the hollow portion. In other words, not all the perimeter of the periphery is surrounded by the hollow portion 9.

Such a configuration can prevent the peeling of each of the color filters 5 to 7 even in a cleaning step in a manufacturing process of the solid-state imaging apparatus, a thermal shock test to the solid-state imaging apparatus, and the like, because each of the color filters 5 to 7 has one peripheral part contacting with adjacent one or more of the color filters.

(Second Embodiment)

Next, a second embodiment of the present invention will be described below.

Figure 4:
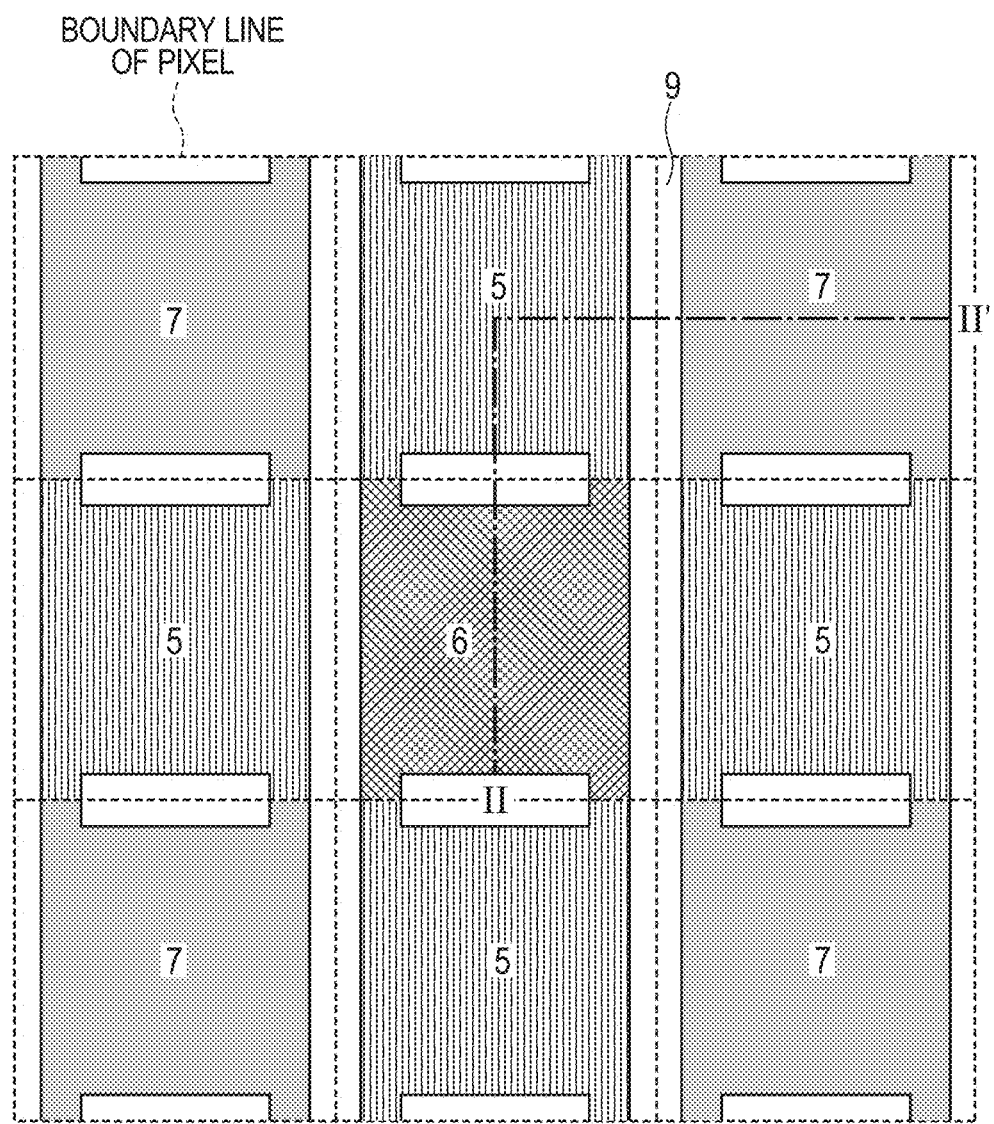
FIG. 4 is a top plan view of each color filter, which is one configuration of a solid-state imaging apparatus (solid-state image sensing device) according to a second embodiment of the present invention.

FIG. 4 is a top plan view of each of color filters 5 to 7, which is one configuration of a solid-state imaging apparatus (solid-state image sensing device) according to the second embodiment of the present invention. Incidentally, in FIG. 4, similar configurations to those illustrated in FIG. 1 are designated by the same reference numerals. A region in which the hollow portion 9 is formed in the solid-state imaging apparatus according to the second embodiment illustrated in FIG. 4 is different from that in the solid-state imaging apparatus according to the first embodiment illustrated in FIG. 1.

As is illustrated in FIG. 4, hollow portions 9 are formed around each of a plurality of the color filters 5 to 7. On this occasion, each of the color filters 5 to 7 has one peripheral part contacting with adjacent one or more of the color filters, and has the other peripheral part around the hollow portion. In other words, not all the perimeter of the periphery is surrounded by the hollow portion 9. In addition, it is desirable that the hollow portion 9 has a width of 0.1 µm or less, from the viewpoint of enhancing the light-concentrating efficiency to the light receiving portion which is provided in every pixel.

One example of a method of manufacturing a solid-state imaging apparatus according to the second embodiment is similar to that illustrated in FIG. 3. On this occasion, in the present embodiment, the cross section of the solid-state imaging apparatus illustrated in FIG. 3A to FIG. 3E corresponds to the cross section of II to II' illustrated in FIG. 4.

When the method of manufacturing the solid-state imaging apparatus illustrated in FIG. 3 is applied to the present embodiment, in the step of forming the photoresist 8 illustrated in FIG. 3B, the photoresist 8 is formed on a region in which each of the color filters 5 to 7 illustrated in FIG. 4 is formed, and the photoresist 8 is not formed on a region in which the hollow portion 9 is formed (specifically, which becomes aperture).

Also in the second embodiment, as is illustrated in FIG. 4, each of the color filters 5 to 7 has one peripheral part contacting with adjacent one or more of the color filters, and has the other peripheral part around the hollow portion. Specifically, not all the perimeter of the periphery is surrounded by the hollow portion 9.

Such a configuration can prevent the peeling of each of the color filters 5 to 7 even in a cleaning step in a manufacturing process of the solid-state imaging apparatus, a thermal shock test to the solid-state imaging apparatus, and the like, because each of the color filters 5 to 7 has one peripheral part contacting with adjacent one or more of the color filters.

(Third Embodiment)

Next, a third embodiment of the present invention will be described below.

Figure 5:
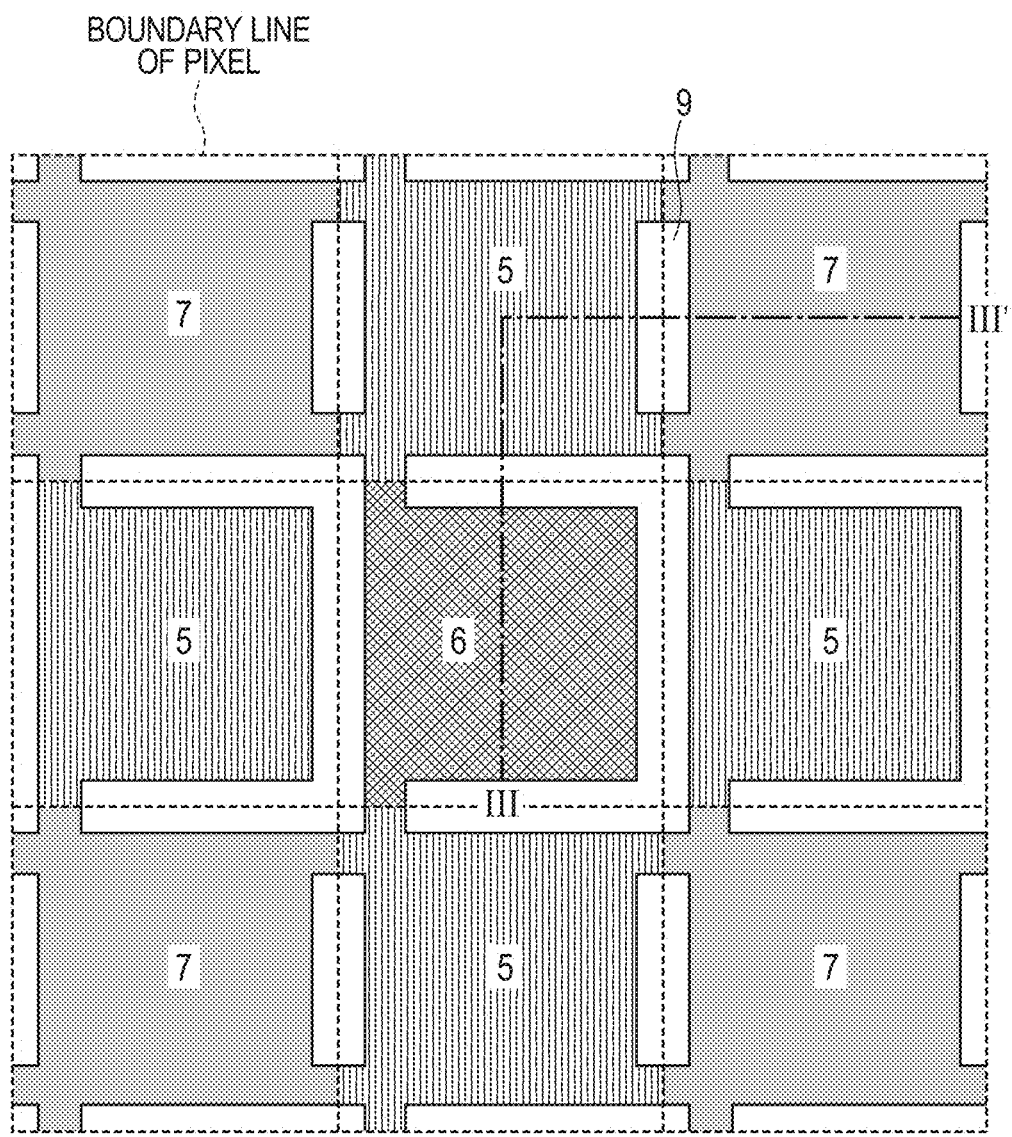
FIG. 5 is a top plan view of each color filter, which is one configuration of a solid-state imaging apparatus (solid-state image sensing device) according to a third embodiment of the present invention.

FIG. 5 is a top plan view of each of color filters 5 to 7, which is one configuration of a solid-state imaging apparatus (solid-state image sensing device) according to the third embodiment of the present invention. Incidentally, in FIG. 5, similar configurations to those illustrated in FIG. 1 are designated by the same reference numerals. A region in which the hollow portion 9 is formed in the solid-state imaging apparatus according to the third embodiment illustrated in FIG. 5 is different from that in the solid-state imaging apparatus according to the first and second embodiments illustrated in FIG. 1 and FIG. 4, respectively.

As is illustrated in FIG. 5, hollow portions 9 are formed around each of a plurality of the color filters 5 to 7. On this occasion, each of the color filters 5 to 7 has one peripheral part contacting with adjacent one or more of the color filters, and has the other peripheral part around the hollow portion. In other words, not all the perimeter of the periphery is surrounded by the hollow portion 9. In addition, it is desirable that the hollow portion 9 has a width of 0.1 µm or less, from the viewpoint of enhancing the light-concentrating efficiency to the light receiving portion which is provided in every pixel.

One example of a method of manufacturing a solid-state imaging apparatus according to the third embodiment is similar to that illustrated in FIG. 3. On this occasion, in the present embodiment, the cross section of the solid-state imaging apparatus illustrated in FIG. 3A to FIG. 3E corresponds to the cross section of III to III" illustrated in FIG. 5.

When the method of manufacturing the solid-state imaging apparatus illustrated in FIG. 3 is applied to the present embodiment, in the step of forming the photoresist 8 illustrated in FIG. 3B, the photoresist 8 is formed on a region in which each of the color filters 5 to 7 illustrated in FIG. 5 is formed, and the photoresist 8 is not formed on a region in which the hollow portion 9 is formed (specifically, which becomes aperture).

Also in the third embodiment, as is illustrated in FIG. 5, each of the color filters 5 to 7 has one peripheral part contacting with adjacent one or more of the color filters, and has the other peripheral part around the hollow portion. In other words, not all the perimeter of the periphery is surrounded by the hollow portion 9.

Such a configuration can prevent the peeling of each of the color filters 5 to 7 even in a cleaning step in a manufacturing process of the solid-state imaging apparatus, a thermal shock test to the solid-state imaging apparatus, and the like, because each of the color filters 5 to 7 has one peripheral part contacting with adjacent one or more of the color filters.

(Fourth Embodiment)

Next, a fourth embodiment of the present invention will be described below.

Figure 6:
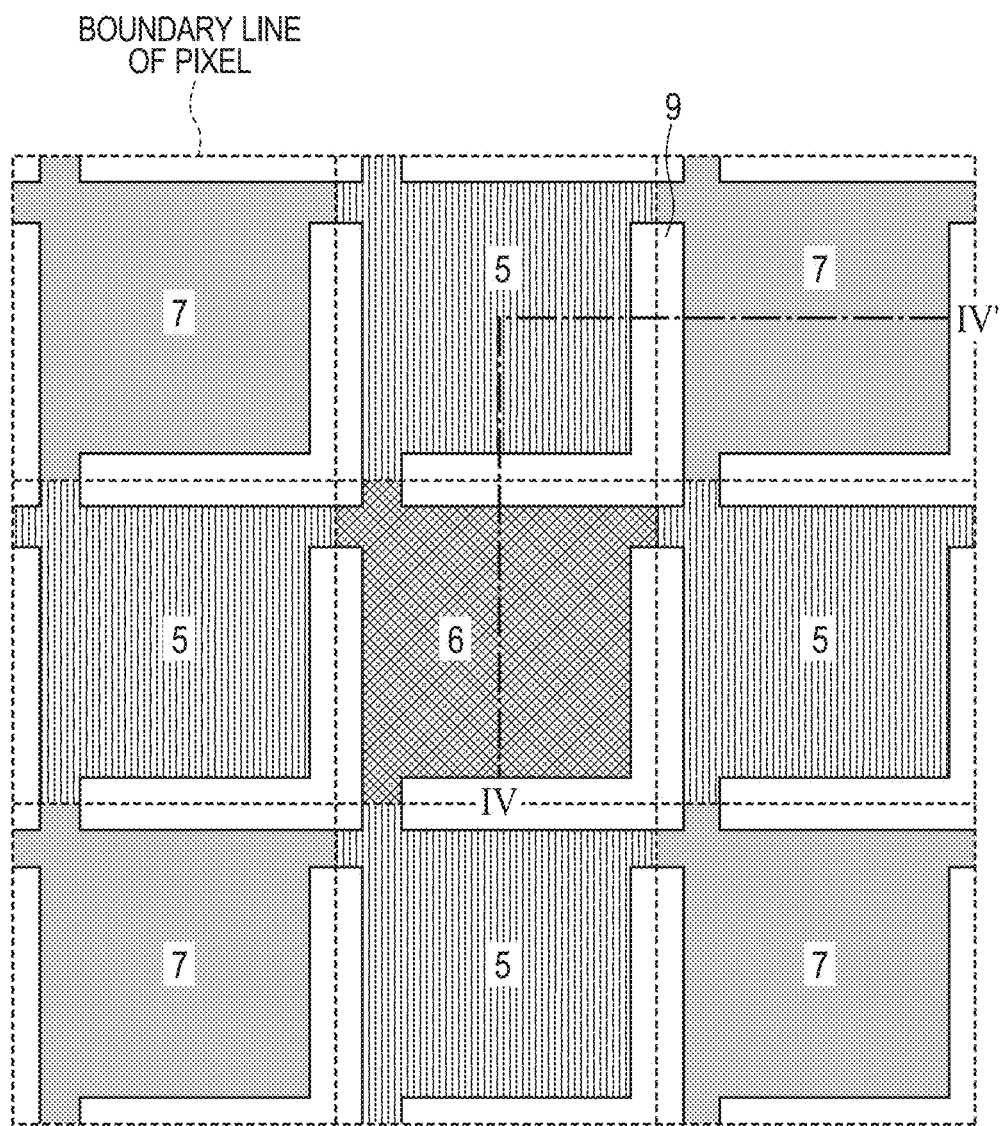
FIG. 6 is a top plan view of each color filter, which is one configuration of a solid-state imaging apparatus (solid-state image sensing device) according to a fourth embodiment of the present invention.

FIG. 6 is a top plan view of each of color filters 5 to 7, which is one configuration of a solid-state imaging apparatus (solid-state image sensing device) according to the fourth embodiment of the present invention. Incidentally, in FIG. 6, similar configurations to those illustrated in FIG. 1 are designated by the same reference numerals. A region in which the hollow portion 9 is formed in the solid-state imaging apparatus according to the fourth embodiment illustrated in FIG. 6 is different from that in the solid-state imaging apparatus according to the first to third embodiments illustrated in FIG. 1, FIG. 4 and FIG. 5, respectively.

As is illustrated in FIG. 6, hollow portions 9 are formed around each of a plurality of the color filters 5 to 7. On this occasion, each of the color filters 5 to 7 has one peripheral part contacting with adjacent one or more of the color filters, and has the other peripheral part around the hollow portion. In other words, not all the perimeter of the periphery is surrounded by the hollow portion 9. In addition, it is desirable that the hollow portion 9 has a width of 0.1 µm or less, from the viewpoint of enhancing the light-concentrating efficiency to the light receiving portion which is provided in every pixel.

One example of a method of manufacturing a solid-state imaging apparatus according to the fourth embodiment is similar to that illustrated in FIG. 3. On this occasion, in the present embodiment, the cross section of the solid-state imaging apparatus illustrated in FIG. 3A to FIG. 3E corresponds to the cross section of IV to IV' illustrated in FIG. 6.

When the method of manufacturing the solid-state imaging apparatus illustrated in FIG. 3 is applied to the present embodiment, in the step of forming the photoresist 8 illustrated in FIG. 3B, the photoresist 8 is formed on a region in which each of the color filters 5 to 7 illustrated in FIG. 6 is formed, and the photoresist 8 is not formed on a region in which the hollow portion 9 is formed (specifically, which becomes aperture).

Also in the fourth embodiment, as is illustrated in FIG. 6, each of the color filters 5 to 7 has one peripheral part contacting with adjacent one or more of the color filters, and has the other peripheral part around the hollow portion. In other words, not all the perimeter of the periphery is surrounded by the hollow portion 9.

Such a configuration can prevent the peeling of each of the color filters 5 to 7 even in a cleaning step in a manufacturing process of the solid-state imaging apparatus, a thermal shock test to the solid-state imaging apparatus, and the like, because each of the color filters 5 to 7 has one peripheral part contacting with adjacent one or more of the color filters.

(Other Embodiments)

In addition, it is also acceptable in the solid-state imaging apparatus (solid-state image sensing device) 100 illustrated in FIG. 3, for instance, to provide an inner lens (inner layer lens) between a multi-layer wiring structure MI (interlayer insulation layer 3) and a first planarized layer 4, above each of the light receiving portions 1, correspondingly to each of the light receiving portions 1. As one example, a convex inner lens is provided, for instance, on the interlayer insulation layer formed from silicon nitride. Thus, the solid-state imaging apparatus can enhance the light-concentrating efficiency to each of the light receiving portions 1, by having the inner lens provided therein and having the inner lens combined with the micro lens 11.

Furthermore, it is also acceptable in the solid-state imaging apparatus (solid-state image sensing device) 100 illustrated in FIG. 3, for instance, to provide a waveguide (optical waveguide) in the interlayer insulation layer 3 above each of the light receiving portions 1, correspondingly to each of the light receiving portions 1. This waveguide is formed, for instance, from silicon nitride which is one example. Thus, the solid-state imaging apparatus can enhance the light-concentrating efficiency to each of the light receiving portions 1, by having the waveguide provided therein.

Note that the above embodiments are merely examples how the present invention can be practiced, and the technical scope of the present invention should not be restrictively interpreted by the embodiments. In other words, the present invention can be practiced in various ways without departing from the technical concept or main features of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-005697, filed Jan. 16, 2013, which is hereby incorporated by reference herein in its entirety.

What is claimed is:

1. A solid-state imaging apparatus comprising:
   a plurality of light receiving portions on one surface of a semiconductor substrate; and
   a plurality of color filters arranged correspondingly to each of the plurality of light receiving portions, wherein
   each of the plurality of color filters has a peripheral edge with a first part in direct contact with an adjacent color filter of the plurality of color filters and a second part separated from the adjacent color filter by a hollow portion provided in a boundary portion between the adjacent color filters, and
   the hollow portion is provided around each of the plurality of color filters, and the hollow portion provided around each of the plurality of color filters is formed in a discontinuous pattern in a plan view.

2. The solid-state imaging apparatus according to claim 1, wherein the hollow portion has a width of 0.1 µm or less.

3. The solid-state imaging apparatus according to claim 1, wherein a length of the first part along the peripheral edge in a plan view is equal to or longer than ½ of a width of the hollow portion.

4. The solid-state imaging apparatus according to claim 1, further comprising a sealing layer sealing an aperture area of the hollow portion.

5. The solid-state imaging apparatus according to claim 1, wherein each of the plurality of color filters has the first portion provided on a corner area thereof.

6. The solid-state imaging apparatus according to claim 1, further comprising a micro lens formed above each of the plurality of color filters, correspondingly to each of the plurality of light receiving portions.

7. A method for manufacturing a solid-state imaging apparatus, wherein the method comprises:
   forming a plurality of light receiving portions on one surface of a semiconductor substrate; and
   preparing a plurality of color filters arranged correspondingly to each of the plurality of light receiving portions, wherein
   each of the plurality of color filters has a peripheral edge with a first part in direct contact with an adjacent color filter of the plurality of color filters and a second part separated from the adjacent color filter by a hollow portion provided in a boundary portion between the adjacent color filters, and
   the hollow portion is provided around each of the plurality of color filters, and the hollow portion provided around each of the plurality of color filters is formed in a discontinuous pattern in a plan view.

* * * * *